(12) United States Patent
Zhao et al.

(10) Patent No.: US 11,626,483 B2
(45) Date of Patent: Apr. 11, 2023

(54) LOW-LEAKAGE REGROWN GAN P-N JUNCTIONS FOR GAN POWER DEVICES

(71) Applicants: Yuji Zhao, Chandler, AZ (US); Kai Fu, Tempe, AZ (US); Houqiang Fu, Tempe, AZ (US)

(72) Inventors: Yuji Zhao, Chandler, AZ (US); Kai Fu, Tempe, AZ (US); Houqiang Fu, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 241 days.

(21) Appl. No.: 17/031,342

(22) Filed: Sep. 24, 2020

(65) Prior Publication Data

US 2021/0104603 A1 Apr. 8, 2021

Related U.S. Application Data

(60) Provisional application No. 62/912,287, filed on Oct. 8, 2019.

(51) Int. Cl.
*H01L 29/06* (2006.01)
*H01L 21/30* (2006.01)
(Continued)

(52) U.S. Cl.
CPC ...... *H01L 29/0661* (2013.01); *H01L 21/0254* (2013.01); *H01L 21/02057* (2013.01); *H01L 21/0262* (2013.01); *H01L 21/02389* (2013.01); *H01L 21/02634* (2013.01); *H01L 21/3006* (2013.01); *H01L 21/30612* (2013.01);
(Continued)

(58) Field of Classification Search
None
See application file for complete search history.

(56) References Cited

U.S. PATENT DOCUMENTS 10,964,749 B2   3/2021   Fu et al.
2010/0148224 A1   6/2010   Zhao
(Continued)

OTHER PUBLICATIONS

I. C. Kizilyalli, A. P. Edwards, H. Nie, D. Bour, T. Prunty, and D. Disney, "3.7 kV Vertical GaN PN Diodes," IEEE Electron Device Lett., Feb. 2014, 35(2):247-249, doi:10.1109/LED.2013.2294175.
(Continued)

*Primary Examiner* — Robert K Carpenter
(74) *Attorney, Agent, or Firm* — Fish & Richardson P.C.

(57) ABSTRACT

Fabricating a regrown GaN p-n junction includes depositing a n-GaN layer on a substrate including $n^+$-GaN, etching a surface of the n-GaN layer to yield an etched surface, depositing a p-GaN layer on the etched surface, etching a portion of the n-GaN layer and a portion of the p-GaN layer to yield a mesa opposite the substrate, and passivating a portion of the p-GaN layer around an edge of the mesa. The regrown GaN p-n junction is defined at an interface between the n-GaN layer and the p-GaN layer. The regrown GaN p-n junction includes a substrate, a n-GaN layer on the substrate having an etched surface, a p-GaN layer on the etched surface, a mesa defined by an etched portion of the n-GaN layer and an etched portion of the p-GaN layer, and a passivated portion of the p-GaN layer around an edge of the mesa.

20 Claims, 7 Drawing Sheets

(51) Int. Cl.
| | |
|---|---|
| *H01L 21/02* | (2006.01) |
| *H01L 21/306* | (2006.01) |
| *H01L 21/324* | (2006.01) |
| *H01L 29/20* | (2006.01) |
| *H01L 29/872* | (2006.01) |
| *H01L 29/808* | (2006.01) |
| *H01L 29/735* | (2006.01) |

(52) U.S. Cl.
CPC ...... *H01L 21/3245* (2013.01); *H01L 29/0623* (2013.01); *H01L 29/2003* (2013.01); *H01L 29/735* (2013.01); *H01L 29/8083* (2013.01); *H01L 29/872* (2013.01)

(56) References Cited

U.S. PATENT DOCUMENTS

| | | | |
|---|---|---|---|
| 2013/0032814 | A1 | 2/2013 | Bour et al. |
| 2014/0312355 | A1 | 10/2014 | Kizilyalli et al. |
| 2015/0137137 | A1 | 5/2015 | Chowdhury et al. |
| 2018/0182882 | A1 | 6/2018 | Hashimoto et al. |
| 2019/0115448 | A1 | 4/2019 | Chowdhury et al. |
| 2020/0144328 | A1 | 5/2020 | Fu et al. |
| 2020/0273965 | A1* | 8/2020 | Kizilyalli ............ H01L 21/7605 |
| 2021/0242281 | A1 | 8/2021 | Fu et al. |
| 2021/0399125 | A1 | 12/2021 | Huang et al. |
| 2022/0013671 | A1 | 1/2022 | Zhao et al. |

OTHER PUBLICATIONS

K. Nomoto, Z. Hu, B. Song, M. Zhu, M. Qi, R. Yan, V. Protasenko, E. Imhoff, J. Kuo, N. Kaneda, T. Mishima, T. Nakamura, D. Jena, and H. G. Xing, "GaN-on-GaN p-n power diodes with 3.48 kV and 0.95 mΩ-cm2: A record high figure-of-merit of 12.8 GW/cm2," in 2015 IEEE International Electron Devices Meeting (IEDM), 2015, pp. 9.7.1-9.7.4, doi: 10.1109/IEDM.2015.7409665.

Z. Hu, K. Nomoto, B. Song, M. Zhu, M. Qi, M. Pan, X. Gao, V. Protasenko, D. Jena, and H. G. Xing, "Near unity ideality factor and Shockley-Read-Hall lifetime in GaN-on-GaN p-n diodes with avalanche breakdown," Appl. Phys. Lett., Dec. 2015, vol. 107, pp. 243501 (6 pages), doi: 10.1063/1.4937436.

M. Qi, K. Nomoto, M. Zhu, Z. Hu, Y. Zhao, V. Protasenko, B. Song, X. Yan, G. Li, J. Verma, S. Bader, P. Fay, H. G. Xing, and D. Jena, "High breakdown single-crystal GaN p-n diodes by molecular beam epitaxy," Appl. Phys. Lett., vol. 107, pp. 232101-1-232101-4, Dec. 2015, doi: 10.1063/1.4936891.

A. M. Armstrong, A. A. Allerman, A. J. Fischer, M. P. King, M. S. van Heukelom, M. W. Moseley, R. J. Kaplar, J. J. Wierer, M. H. Crawford, and J. R. Dickerson, "High voltage and high current density vertical GaN power diodes," Electron. Lett., vol. 52, No. 13, pp. 1170-1171, Jun. 2016, doi: 10.1049/el.2016.1156.

H. Nie, Q. Diduck, B. Alvarez, A. P. Edwards, B. M. Kayes, M. Zhang, G. Ye, T. Prunty, D. Bour, and I. C. Kizilyalli, "1.5-kV and 2.2-mΩ-cm\(/\{2}\) Vertical GaN Transistors on Bulk-GaN Substrates," IEEE Electron Device Lett., Sep. 2014, 35(9):939-941, doi: 10.1109/LED.2014.2339197.

R. Yeluri, J. Lu, C. A. Hurni, D. A. Browne, S. Chowdhury, S. Keller, J. S. Speck, and U. K. Mishra, "Design, fabrication, and performance analysis of GaN vertical electron transistors with a buried p/n junction," Appl. Phys. Lett., May 5, 2015, vol. 106, pp. 183502 (6 pages), doi: 10.1063/1.4919866.

S. C. Cruz, S. Keller, T. E. Mates, U. K. Mishra, and S. P. DenBaars, "Crystallographic orientation dependence of dopant and impurity incorporation in GaN films grown by metalorganic chemical vapor deposition," J. Cryst. Growth, vol. 311, No. 15, pp. 3817-3823, Jul. 2009, doi: 10.1016/j.jcrysgro.2009.02.051.

H. Xing, D. S. Green, H. Yu, T. Mates, P. Kozodoy, S. Keller, S. P. DenBaars, and U. K. Mishra, "Memory effect and redistribution of Mg into sequentially regrown GaN layer by metalorganic chemical vapor deposition," Jpn. J. Appl. Phys., vol. 42, pp. 50-53, Sep. 2003, doi: 10.1143/JJAP.42.50.

S. Chowdhury, B. L. Swenson, J. Lu, and U. K. Mishra, "Use of sub-nanometer thick AlN to arrest diffusion of ion-implanted Mg into regrown AlGaN/GaN layers," Jpn. J. Appl. Phys., vol. 50, pp. 101002-1-101002-5, Oct. 2011, doi: 10.1143/JJAP.50.101002.

M. Zhu, B. Song, Z. Hu, K. Nomoto, M. Pan, X. Gao, D. Jena, and H. Xing, "Comparing buffer leakage in PolarMOSH on SiC and freestanding GaN substrates," in Proc. IEEE Lester Eastman Conf. (LEC), Aug. 2016, pp. 27-30, doi: 10.1109/LEC.2016.7578926.

S. Nakamura, T. Mukai, M. Senoh, and N. Iwasa, "Thermal annealing effects on P-type Mg-doped GaN films," Jpn. J. Appl. Phys., vol. 31, No. 2B, pp. L139-L142, Feb. 1992, doi: 10.1143/JJAP.31.L139.

S. Nakamura, N. Iwasa, M. Senoh, and T. Mukai, "Hole compensation mechanism of P-type GaN films," Jpn. J. Appl. Phys., vol. 31, No. 5A, pp. 1258-1266, May 1992, doi: 10.1143/JJAP.31.1258.

W. Götz, N. M. Johnson, J. Walker, D. P. Bour, H. Amano, and I. Akasaki, "Hydrogen passivation of Mg acceptors in GaN grown by metalorganic chemical vapor deposition," Appl. Phys. Lett., vol. 67, No. 18, pp. 2666-2668, Oct. 1995, doi: 10.1063/1.114330.

K. Nomoto, B. Song, Z. Hu, M. Zhu, M. Qi, N. Kaneda, T. Mishima, T. Nakamura, D. Jena, and H. G. Xing, "1.7-kV and 0.55-mΩ • {cm}/\{2} GaN p-n Diodes on Bulk GaN Substrates With Avalanche Capability," IFEE Electron Device Lett., Feb. 2016, vol. 37(2):161-164, doi: 10.1109/LED.2015.2506638.

M. Zhu, M. Qi, K. Nomoto, Z. Hu, B. Song, M. Pan, X. Gao, D. Jena, and H. G. Xing, "Electron mobility in polarization-doped Al0—0.2GaN with a low concentration near 1017 cm-3," Appl. Phys. Lett., vol. 110, pp. 182102-1-182102-5, May 2017, doi: 10.1063/1.4982920.

D. Jena, "Polarization induced electron populations in III-V nitride semiconductors: Transport, growth, and device applications," Ph.D. dissertation, Dept. Elect. Comput. Eng., Univ. California, Santa Barbara, CA, USA, 2003, 187 pp.

D. P. Han, C. H. Oh, H. Kim, J. I. Shim, K. S. Kim, and D. S. Shin, "Conduction mechanisms of leakage currents in InGaN/GaN-based light-emitting diodes," IEEE Trans. Electron Devices, vol. 62, No. 2, pp. 587-592, Feb. 2015, doi: 10.1109/TED.2014.2381218.

Y. Zhang, H.-Y. Wong, M. Sun, S. Joglekar, L. Yu, N. A. Braga, R. V. Mickevicius, and T. Palacios, "Design space and origin of off-state leakage in GaN vertical power diodes," in IEDM Tech. Dig., Dec. 2015, pp. 35.1.1-35.1.4, doi: 10.1109/IEDM.2015.7409830.

N. Apsley and H. P. Hughes, "Temperature- and field-dependence of hopping conduction in disordered systems, II," Philos. Mag., vol. 31, pp. 1327-1339, Apr. 1975, doi: 10.1080/00318087508228686.

Y. Zhang, M. Sun, D. Peidra, M. Azize, X. Zhang, T. Fujishima, and T. Palacios, "GaN-on-Si vertical schottky and p-n diodes," IEEE Electron Device Lett., vol. 35, No. 6, pp. 618-620, Jun. 2014, doi: 10.1109/LED.2014.2314637.

X. Zou, X. Zhang, X. Lu, C. W. Tang, and K. M. Lau, "Fully vertical GaN p-i-n diodes using GaN-on-Si epilayers," IEEE Electron Device Lett., vol. 37, No. 5, pp. 636-639, May 2016, doi: 10.1109/LED.2016.2548488.

D. Yoo, J. B. Limb, J.-H. Ryou, W. Lee, and R. D. Dupuis, "Epitaxial growth and device design optimization of full-vertical GaN p-i-n Rectifiers," J. Electron. Mater., vol. 36, No. 4, pp. 353-358, Apr. 2007, doi: 10.1007/sl1664-006-0069-1.

J. B. Limb, D. Yoo, J.-H. Ryou, S. C. Shen, and R. D. Dupuis, "Low on-resistance GaN pin rectifiers grown on 6H—SiC substrates," Electron. Lett., vol. 43, No. 6, pp. 67-68, Mar. 2007, doi: 10.1049/el:20070065.

T. G. Zhu, D. J. Lambert, B. S. Shelton, M. M. Wong, U. Chowdhury, H. K. Kwon, and R. D. Dupuis, "High-voltage GaN pin vertical rectifiers with 2 µm thick i-Layer," Electron Lett., vol. 36, No. 23, pp. 1971-1972, Nov. 2000, doi: 10.1049/el:20001329.

T.-T. Kao, J. Kim, T.-C. Lee, M.-H. Ji, T. Detchprohm, R. D. Dupuis, and S.-C. Shen, "Homojunction GaN p-i-n rectifiers with ultralow on-state resistance," in Proc. CSMANTECH Conf., May 2014, pp. 157-160, doi: N/A.

B.-S. Zheng, P.-Y. Chen, C.-J. Yu, Y.-F. Chang, C.-L. Ho, M.-C. Wu, and K.-C. Hsieh, "Suppression of current leakage along mesa

(56) References Cited

OTHER PUBLICATIONS surfaces in GaN-based p-i-n diodes," IEEE Electron Device Lett., vol. 36, No. 9, pp. 932-934, Sep. 2015, doi: 10.1109/LED.2015.2458899.

I. C. Kizilyalli, A. P. Edwards, H. Nie, D. Disney, and D. Bour, "High Voltage Vertical GaN p-n Diodes With Avalanche Capability," IEEE Trans. Electron. Devices, Oct. 2013, 60(10):3067-3070, doi: 10.1109/TED.2013.2266664.

Y. Hatakeyama, K. Nomoto, A. Terano, N. Kaneda, T. Tsuchiya, T. Mishima, and T. Nakamura, "High-Breakdown-Voltage and Low-Specific-on-Resistance GaN p-n Junction Diodes on Free-Standing GaN Substrates Fabricated Through Low-Damage Field-Plate Process," Jpn J Appl Phys, 2013, vol. 52, pp. 028007 (4 pages), doi: 10.7567/jjap.52.028007.

H. Ohta, N. Kaneda, F. Horikiri, Y. Narita, T. Yoshida, T. Mishima, and T. Nakamura, "Vertical GaN p-n Junction Diodes With High Breakdown Voltages Over 4 kV," IEEE Electron Device Lett., Nov. 2015, 36(11):1180-1182, doi: 10.1109/LED.2015.2478907.

H. Xing, S. P. DenBaars, and U. K. Mishra, "Characterization of AlGaN/GaNp-n diodes with selectively regrown n-AlGaN by metalorganic chemical-vapor deposition and its application to GaN-based bipolar transistors," J. Appl. Phys., 2005, vol. 97, pp. 113703 (5 pages), doi: 10.1063/1.1914952.

G. Koblmüller, R. M. Chu, A. Raman, U. K. Mishra, and J. S. Speck, "High-temperature molecular beam epitaxial growth of AlGaN/GaN on GaN templates with reduced interface impurity levels," J. Appl. Phys., 2010, vol. 107, pp. 043527 (10 pages), doi: 10.1063/1.3285309.

Y. Cao, T. Zimmermann, H. Xing, and D. Jena, "Polarization-engineered removal of buffer leakage for GaN transistors," Appl. Phys. Lett., vol. 96, pp. 042102-1-042102-3, Jan. 2010, doi: 10.1063/1.3293454.

U. K. Mishra, L. Shen, T. E. Kazior, and Y. Wu, "GaN-Based RF Power Devices and Amplifiers," Proc. IEEE, Feb. 2008, 96(2)287-305, doi: 10.1109/JPROC.2007.911060.

B. J. Baliga, "Gallium nitride devices for power electronic applications," Semicond. Sci. Tech., Jun. 21, 2013, vol. 28, pp. 074011 (9 pages), doi: 10.1088/0268-1242/28/7/074011.

J. Millán, P. Godignon, X. Perpiñà, A. Pérez-Tomás, and J. Rebollo, "A Survey of Wide Bandgap Power Semiconductor Devices," IEEE T. Power Electr., May 2014, 29(5):2155-2163, doi: 10.1109/TPEL.2013.2268900.

R. D. Underwood, D. Kapolnek, B. P. Keller, S. Keller, S. P. Denbaars, and U. K. Mishra, "Selective-area regrowth of GaN field emission tips," Solid-State Electron, Feb. 1, 1997, 41(2):243-245, doi: https://doi.org/10.1016/S0038-1101(96)00209-2.

V. Adivarahan, M. Gaevski, A. Koudymov, J. Yang, G. Simin, and M. A. Khan, "Selectively Doped High-Power AlGaN/InGaN/GaN MOS-DHFET," IEEE Electron Device Lett., Mar. 2007, 28(3):192-194, doi: 10.1109/LED.2007.891386.

B. S. Shelton, D. J. H. Lambert, H. Jian Jang, M. M. Wong, U. Chowdhury, Z. Ting Gang, H. K. Kwon, Z. Liliental-Weber, M. Benarama, M. Feng, and R. D. Dupuis, "Selective area growth and characterization of AlGaN/GaN heterojunction bipolar transistors by metalorganic chemical vapor deposition," IEEE Trans. Electron. Devices, Mar. 2001, 48(3):490-494, doi: 10.1109/16.906441.

S. O. Kucheyev, J. S. Williams, and S. J. Pearton, "Ion implantation into GaN," Materials Science and Engineering: R: Reports, vol. 33, pp. 51-107, 2001, doi: 10.1016/S0927-796X(01)00028-6.

J. K. Shen and G. C. Chi, "The doping process and dopant characteristics of GaN," Journal of Physics: Condensed Matter, vol. 14, pp. R657-R702, 2002, doi: 10.1088/0953-8984/14/22/201.

Z. Hu, K. Nomoto, M. Qi, W. Li, M. Zhu, X. Gao, D. Jena, and H. G. Xing, "1.1-kV Vertical GaN p-n Diodes With p-GaN Regrown by Molecular Beam Epitaxy," IEEE Electron Device Lett., Aug. 2017, 38(8):1071-1074, doi: 10.1109/led.2017.2720747.

Y. Zhang, Z. Liu, M. J. Tadjer, M. Sun, D. Piedra, C. Hatem, T. J. Anderson, L. E. Luna, A. Nath, A. D. Koehler, H. Okumura, J. Hu, X. Zhang, X. Gao, B. N. Feigelson, K. D. Hobart, and T. Palacios, "Vertical GaN Junction Barrier Schottky Rectifiers by Selective Ion Implantation," IEEE Electron Device Lett., Aug. 2017, 38(8):1097-1100, doi: 10.1109/LED.2017.2720689.

K. Fu, H. Fu, H. Liu, S. R. Alugubelli, T. Yang, X. Huang, H. Chen, I. Baranowski, J. Montes, F. A. Ponce, and Y. Zhao, "Investigation of GaN-on-GaN vertical p-n diode with regrown p-GaN by metalorganic chemical vapor deposition," Appl. Phys. Lett., vol. 113, pp. 233502 (5 pages), 2018, doi: 10.1063/1.5052479.

H. Fu, K. Fu, H. Liu, S. R. Alugubelli, X. Huang, H. Chen, J. Montes, T. Yang, C. Yang, J. Zhou, F. A. Ponce, and Y. Zhao," Implantation-and etching—free high voltage vertical GaN p-n diodes terminated by plasma-hydrogenated p-GaN: revealing the role of thermal annealing," Appl. Phys. Express, vol. 12, pp. 051015 (7 pages), 2019, doi: 10.7567/1882-0786/ab1813.

H. Fu, K. Fu, X. Huang, H. Chen, I. Baranowski, T. Yang, J. Montes, and Y. Zhao, "High Performance Vertical GaN-on-GaN p-n Power Diodes With Hydrogen-Plasma-Based Edge Termination," IEEE Electron Device Lett., Jul. 2018, 39(7):1018-1021, doi: 10.1109/LED.2018.2837625.

J. B. Limb, D. Yoo, J.-H. Ryou, W. Lee, S.-C. Shen, and R. D. Dupuis, "High performance GaN pin rectifiers grown on free-standing GaN substrates," Electron Lett., Oct. 26, 2006, 42(22):1313-1314 (3 pages), doi: 10.1049/el_20062261.

Y. Yoshizumi, S. Hashimoto, T. Tanabe, and M. Kiyama, "High-breakdown-voltage pn-junction diodes on GaN substrates," J. Cryst. Growth, 2007, 298:875-878, doi: 10.1016/j.jcrysgro.2006.10.246.

K. Nomoto, Y. Hatakeyama, H. Katayose, N. Kaneda, T. Mishima, and T. Nakamura, "Over 1.0 kV GaN p-n junction diodes on free-standing GaN substrates," physica status solidi (a), 2011, 208(7):1535-1537, doi: 10.1002/pssa.201000976.

H. Fu, X. Huang, H. Chen, Z. Lu, X. Zhang, and Y. Zhao, "Effect of Buffer Layer Design on Vertical GaN-on-GaN p-n and Schottky Power Diodes," IEEE Electron Device Lett., 2017, 38(6):763-766, doi: 10.1109/LED.2017.2690974.

* cited by examiner

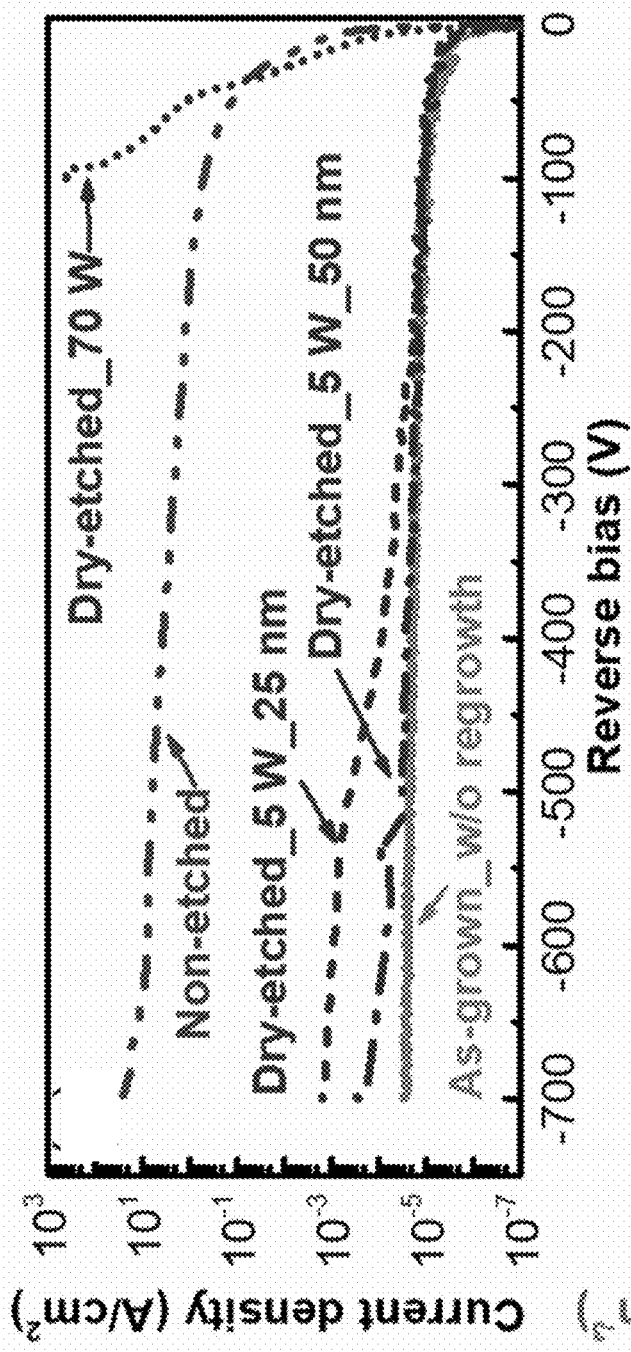
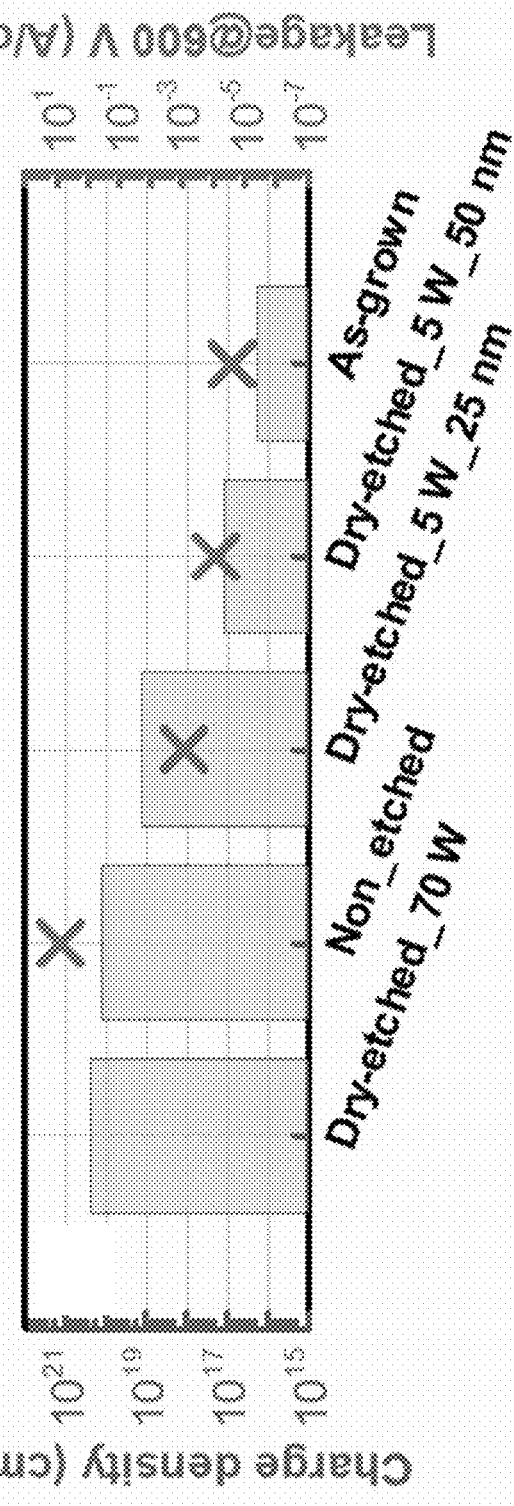
FIG. 4A
FIG. 4B

LOW-LEAKAGE REGROWN GAN P-N JUNCTIONS FOR GAN POWER DEVICES

CROSS-REFERENCE TO RELATED APPLICATION

This application claims the benefit of U.S. Patent Application No. 62/912,287 entitled "LOW-LEAKAGE REGROWN GAN P-N JUNCTIONS FOR GAN POWER DEVICES" and filed on Oct. 8, 2019, which is incorporated by reference herein in its entirety.

STATEMENT OF GOVERNMENT INTEREST

This invention was made with government support under DE-AR0000868 awarded by the Department of Energy. The government has certain rights in the invention.

TECHNICAL FIELD

This disclosure relates to low-leakage regrown GaN p-n junctions, devices including these junctions, and methods of fabricating these junctions.

BACKGROUND

The wide bandgap (WBG) semiconductor gallium nitride (GaN) has a large bandgap (3.4 eV), high breakdown electric field (~3.0 MV/cm), and high Baliga's figure of merit (~$10^3$ times larger than that of Si). Due to the lack of native GaN substrates, GaN power devices have typically been heteroepitaxially grown on lattice-mismatched foreign substrates (e.g., sapphire) with large defect densities (>$10^9$ cm$^{-2}$). GaN crystal growth by hydride vapor phase epitaxy (HVPE) and the ammonothermal has also been used to yield free-standing bulk GaN substrates.

Dry etching can be used to form selectively regrown areas prior to regrowth. However, this etch-then-regrow process presents some challenges. First, after regrowth, an interface containing a high concentration of contaminants such as silicon (Si), carbon (C), and oxygen (O) is formed even without any etching. Second, the dry etching process can introduce surface damage. The contaminants and surface damage can result in high reverse leakage current for regrown p-n junctions.

SUMMARY

This disclosure relates to low-leakage regrown GaN p-n junctions, devices including these junctions, and methods of fabricating these junctions. These low-leakage regrown GaN p-n junctions can be used as building blocks for various advanced vertical GaN power electronics, such as vertical junction field-effect transistors (VJFETs), junction barrier Schottky (JBS) diodes, superjunctions (SJs), and insulated-gate bipolar transistors (IGBTs), which can be used in a variety of high voltage, high current, high power, and high frequency applications. Fabrication methods include metalorganic chemical vapor deposition (MOCVD), combining low damage etching techniques and surface treatments. The regrown p-n junctions show low current leakage (e.g., on the order of 10 nA at −600 V) and high breakdown voltages (e.g., over 1.2 kV).

In a first general aspect, fabricating a regrown GaN p-n junction includes depositing a n-GaN layer on a substrate including n$^+$-GaN, etching a surface of the n-GaN layer to yield an etched surface, depositing a p-GaN layer on the etched surface, etching a portion of the n-GaN layer and a portion of the p-GaN layer to yield a mesa opposite the substrate, and passivating a portion of the p-GaN layer around an edge of the mesa. The regrown GaN p-n junction is defined at an interface between the n-GaN layer and the p-GaN layer.

Implementations of the first general aspect may include one or more of the following features.

In some cases, the n-GaN layer is unintentionally doped. Depositing the n-GaN layer can include metalorganic chemical vapor deposition. Etching the surface of the n-GaN layer can include wet etching. Etching the surface of the n-GaN layer can occur in multiple steps (e.g., four steps). The multiple steps may decrease in power.

In some implementations, the first general aspect includes cleaning the etched surface before depositing the p-GaN layer. In certain implementations, the first general aspect includes depositing an insertion layer between the etched surface and the p-GaN layer. In some cases, the p-GaN layer is activated before etching the portion of the n-GaN layer and the portion of the p-GaN layer. Etching the portion of the n-GaN layer and the portion of the p-GaN layer cocan include mprises dry etching. Passivating the portion of the p-GaN layer typically includes hydrogen-plasma passivation.

In certain implementations, the first general aspect includes depositing a first metal stack on an outer surface of the p-GaN layer and a second metal stack on an outer surface of the substrate. The first metal stack and the second metal stack may be subjected to rapid thermal annealing.

In a second general aspect, a regrown GaN p-n junction includes a substrate, a n-GaN layer on the substrate having an etched surface, a p-GaN layer on the etched surface, a mesa defined by an etched portion of the n-GaN layer and an etched portion of the p-GaN layer, and a passivated portion of the p-GaN layer around an edge of the mesa. An interface between the n-GaN layer and the p-GaN layer defines the regrown GaN p-n junction.

Implementations of the second general aspect may include one or more of the following features.

In some cases, the substrate includes n$^+$-GaN. In certain cases, an insertion layer is positioned between the n-GaN layer and the p-GaN layer. A differential on-resistance of the GaN p-n junction is typically about 8 mΩ·cm$^2$.

In a third general aspect, a device includes the regrown GaN p-n junction of the second general aspect. The device can be a junction barrier Schottky diode, a device with floating field rings, a field effect transistor, or a bipolar junction transistor.

The details of one or more embodiments of the subject matter of this disclosure are set forth in the accompanying drawings and the description. Other features, aspects, and advantages of the subject matter will become apparent from the description, the drawings, and the claims.

BRIEF DESCRIPTION OF DRAWINGS

FIG. 4A shows reverse I-V curves for non-etched and dry-etched samples with different etching powers and insertion thicknesses, and the as-grown sample without regrowth. FIG. 4B shows charge densities at the regrowth interfaces (histogram) and leakage currents at 600 V (cross mark) for the samples in FIG. 4A.

DETAILED DESCRIPTION

This disclosure describes high performance GaN p-n junctions with regrown p-GaN by metalorganic chemical vapor deposition (MOCVD) on dry-etched surfaces. In one example, the breakdown voltage reaches 1.27 kV and the differential on-resistance is 0.8 mΩ·cm². Investigation of the effects of etching power and surface treatment on the reverse leakage characteristics of the regrown p-n junctions demonstrate that lowering the etching power and damage can reduce the leakage currents and increase the breakdown voltages. Further analysis reveals that the charge concentration at the regrowth interface plays a role in the performance of the regrown samples. To avoid sacrificing the etching rate by using only low power etching, a multiple-RF-power etching recipe with gradually decreased etching power is implemented. Thus, practical and viable methods to realize high performance regrown p-n junctions for various advanced GaN power electronics are described.

Figures 1A, 1B, 1C, 1D:
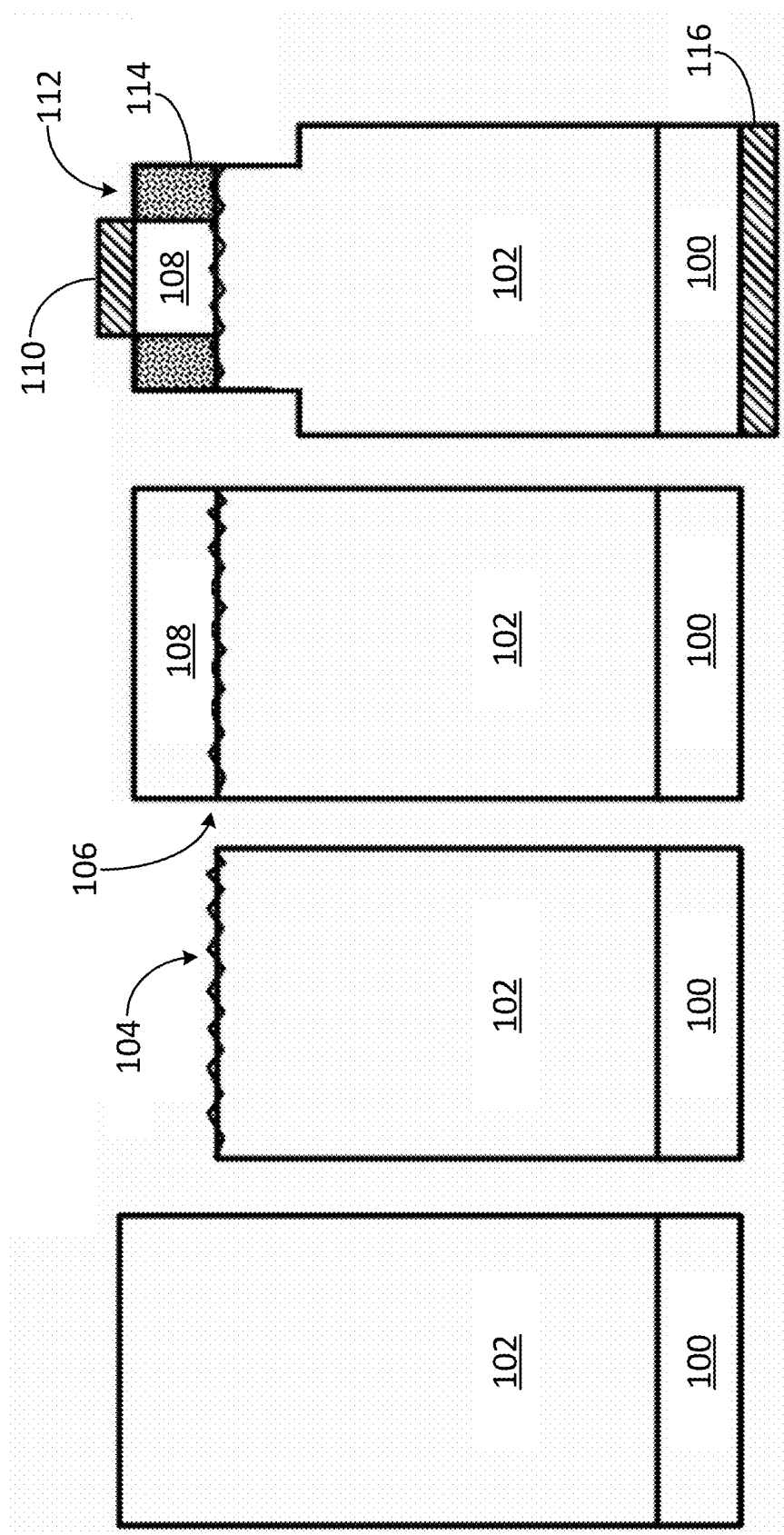
FIGS. 1A-1D depict steps in the fabrication of regrown p-n diodes.

FIGS. 1A-1D depict stages in fabricating a regrown GaN p-n junction. FIG. 1A depicts substrate 100 with unintentionally doped (UID) GaN layer 102 deposited on substrate 100. Substrate 100 includes n⁺-GaN. In one example, substrate 100 is a free-standing c-plane GaN. A suitable n-type dopant is silane. UID GaN layer 102 (e.g., drift layer) is typically grown homoepitaxially by metalorganic chemical vapor deposition (MOCVD) on substrate 100. In one example, UID GaN layer 102 has a thickness of about 9 μm and an electron concentration of about $10^{16}$ cm$^{-3}$.

After UID GaN layer 102 is grown on substrate 100, the surface of UID GaN layer 102 is etched (e.g., wet-etched or dry-etched). Etching can be achieved by inductively coupled plasma (ICP). In one example, the ICP is chlorine-based. A low-power ICP typically reduces damage to the UID GaN layer (e.g., ICP power of about 200 W to about 600 W, and radiofrequency power of about 2 W to about 70 W). The etching can include a multiple-RF power etching recipe. The multiple-RF power etching recipe can include multiple etching steps with decreasing RF power (e.g., about 70 W to about 2 W). The multiple etching steps are typically in a range of 2 to 6 steps (e.g., 4 steps). In one example of four etching steps, the RF power decreases from about 70 W to about 35 W to about 5 W to about 2 W. A multiple-RF-power etching approach gives reasonable etching rates (e.g., in a range between about 15 nm/min and about 25 nm/min) and can effectively reduce the reverse leakage. A regrown stack with a four-step-etching recipe typically has a breakdown voltage in a range of about 1200 V to about 1300 V. With this low-damage ICP etching, reverse leakage of an etched stack can be decreased relative to a non-etched stack. FIG. 1B depicts etched surface 104 of UID GaN layer 102. Etched surface 104 can be treated to reduce surface contaminants (e.g., with UV-ozone, strong acid baths, or both).

In some cases, insertion layer 106 is deposited on etched surface 104 before a regrown p-GaN layer is deposited. Insertion layer 106 can be a thin UID GaN layer (e.g., about 25 nm to about 75 nm).

As depicted in FIG. 1C, regrown p-GaN layer 108 is deposited on insertion layer 106. In some cases, however, regrown p-GaN layer 108 is deposited on etched surface 104. A suitable p-type dopant is bis(cyclopentadienyl)magnesium. In one example, a thickness of p-GaN layer 108 is about 400 nm to about 600 nm (e.g. about 500 nm). A suitable growth temperature is in a range of about 900° C. to about 1040° C.

Activation of regrown p-GaN layer 106 can be carried out by rapid thermal annealing (e.g., at a temperature between about 600° C. and about 700° C. for about 10 min to about 30 in in an inert environment). A thickness of regrown p-GaN layer 108 can be in a range of about 400 nm to about 600 nm. Regrown p-GaN layer 108 typically has a charge concentration in a range of about $10^{17}$ cm$^{-3}$ to about $10^{20}$ cm$^{-3}$ at the regrowth interface. A regrown stack with insertion layer 106 can have a breakdown voltage in a range between about 1250 V and about 1350 V.

Metal stacks of Pd/Ni/Au (e.g., 20 nm/30 nm/50 nm) are deposited by electron beam evaporation to form p-contact 110, depicted in FIG. 1D. Mesa 112 with edge terminations 114 are formed with mesa isolation and hydrogen-plasma passivation. Etching to yield mesa isolation can be achieved by ICP (dry-etching) to simulate a regrown surface. In some cases, the ICP is chlorine-based. The metal stacks can be subjected to rapid thermal annealing (RTA). Metal stacks of Ti/Al/Ni/Au (e.g., 20 nm/130 nm/50 nm/150 nm) are deposited to form backside n-contact 116. The regrown GaN p-n junction is defined between the UID n-GaN layer and the p-GaN layer (e.g., at the interface between UID n-GaN layer and the p-GaN layer). The resulting device typically demonstrates a low leakage current (e.g., about 5 nA to about 15 nA at about 600 V) and a high breakdown voltage (e.g., at least about 1200 V).

Figure 2A:
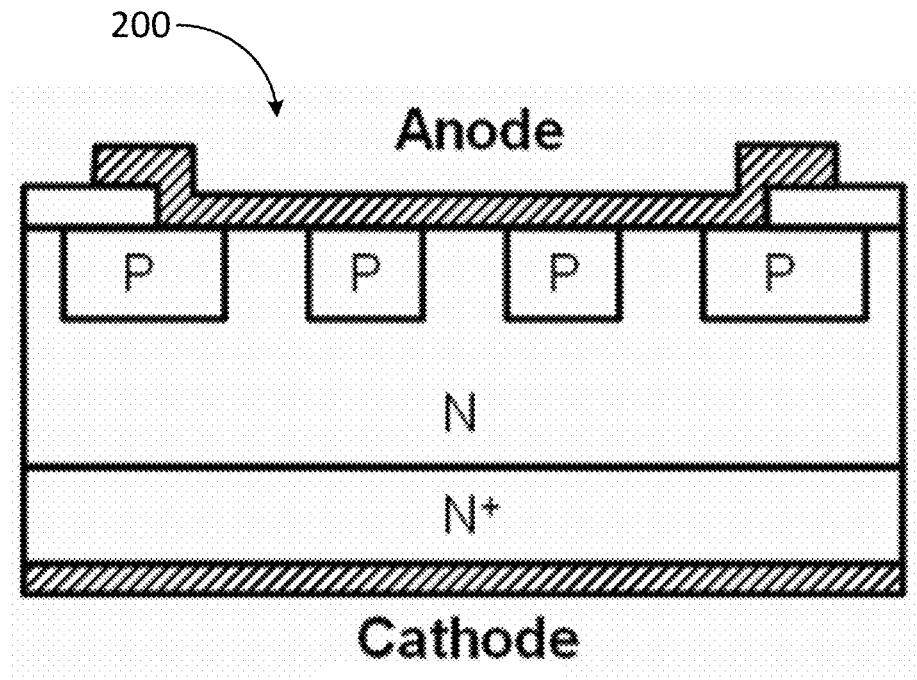
FIGS. 2A-2D are schematics showing applications of regrown p-GaN for junction barrier Schottky diodes, floating field rings, field effect transistors, and bipolar junction transistors, respectively.
Figure 2B:
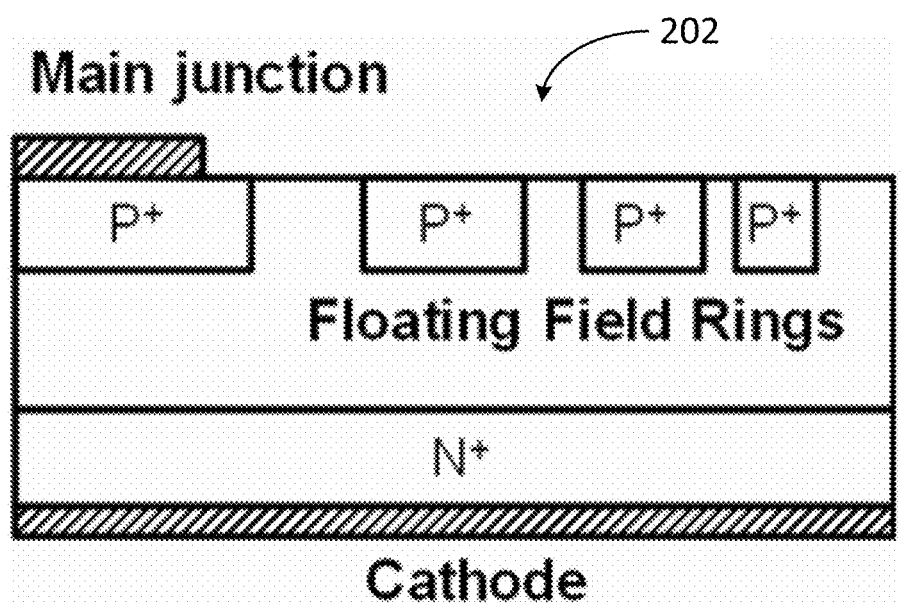
Figure 2C:
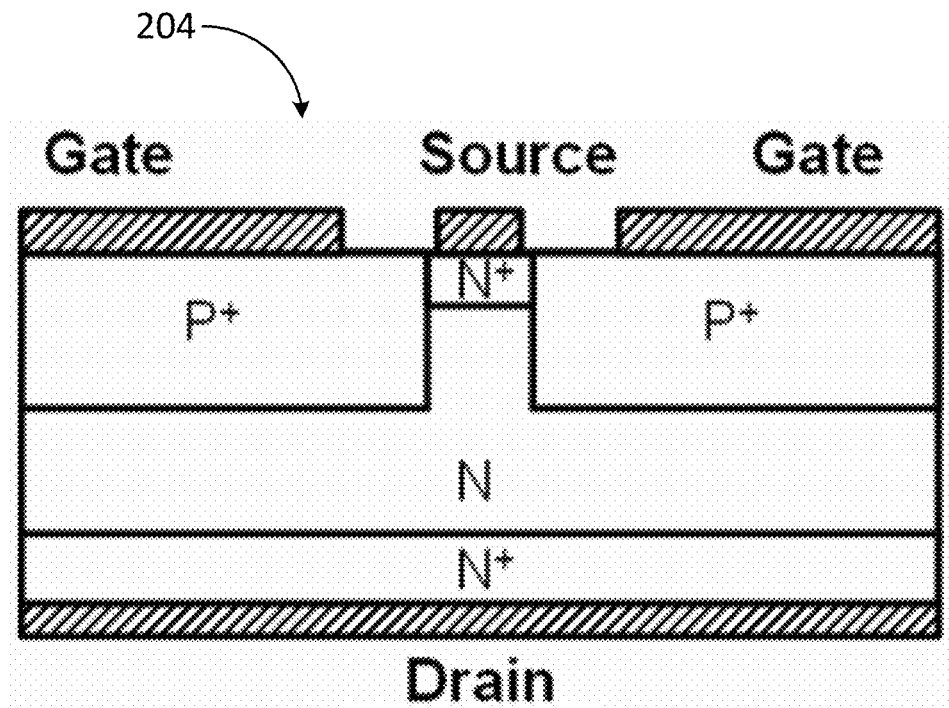
Figure 2D:
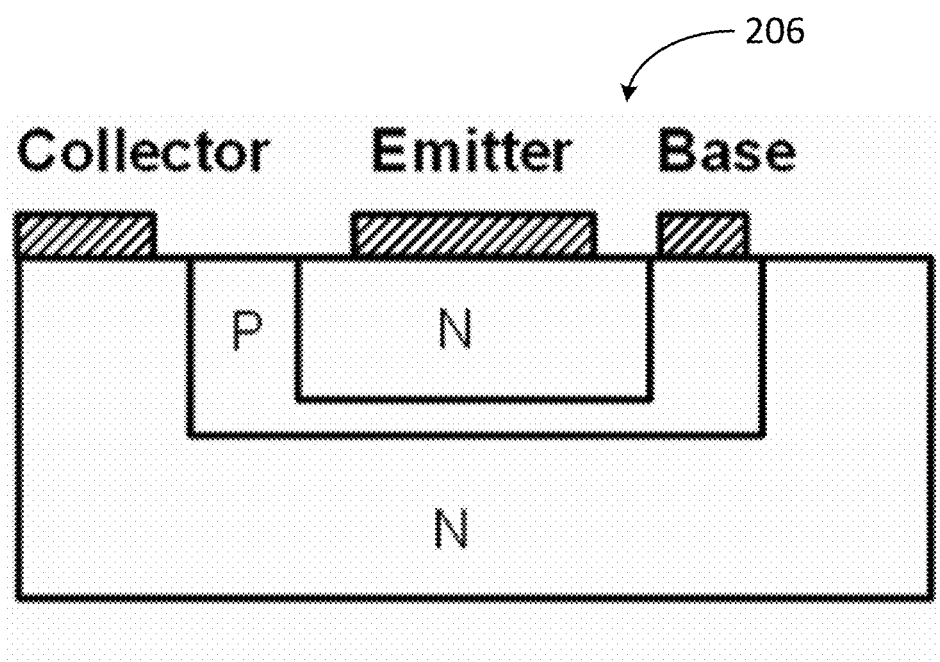

FIGS. 2A-2D are schematics showing applications for selective p-doping by regrowth. FIG. 2A depicts junction barrier Schottky diode 200. 2B depicts device 202 with floating field rings. FIG. 2C depicts field effect transistor 204. FIG. 2D depicts bipolar junction transistor 206 including regrown p-GAN.

EXAMPLES

Samples were grown homoepitaxially by metalorganic chemical vapor deposition (MOCVD) on c-plane n+-GaN free-standing substrates. Hydrogen ($H_2$) was used as the carrier gas to transport the reactants to the heated substrates in the MOCVD reactor. Trimethylgallium (TMGa) and ammonia ($NH_3$) were the source materials for Ga and N, respectively. Bis(cyclopentadienyl)magnesium ($Cp_2Mg$) and silane ($SiH_4$) were used as the precursors for p-type Mg dopants and n-type Si dopants, respectively. The growth temperature was 970-1040° C. Before regrowth, 9-μm-thick unintentionally doped (UID) GaN drift layers with an electron concentration of ~$10^{16}$ cm$^{-3}$ were first grown on the substrates.

Different etching processes were applied to the drift layer, followed by the regrowth process including a thin UID-GaN layer as an insertion layer and a 500 nm p-GaN layer. The activation of the regrown p-GaN was carried out by rapid thermal annealing at 700° C. for 20 min in a $N_2$ environment. Metal stacks of Pd/Ni/Au (20 nm/30 nm/50 nm) were deposited by electron-beam evaporation to form the p-contacts. Mesa isolation and hydrogen-plasma passivation were used for the edge termination. Metal stacks of Ti/Al/Ni/Au (20 nm/130 nm/50 nm/150 nm) were deposited to form backside n-contacts. A Keithley 4200-SCS was used for the capacitance-voltage (C-V) measurement. A Keithley 2410 sourcemeter was used for current-voltage (I-V) measurement. A Tektronix 370A was used for reverse breakdown measurement where the samples were immersed in FC-70.

Figures 3A, 3B:
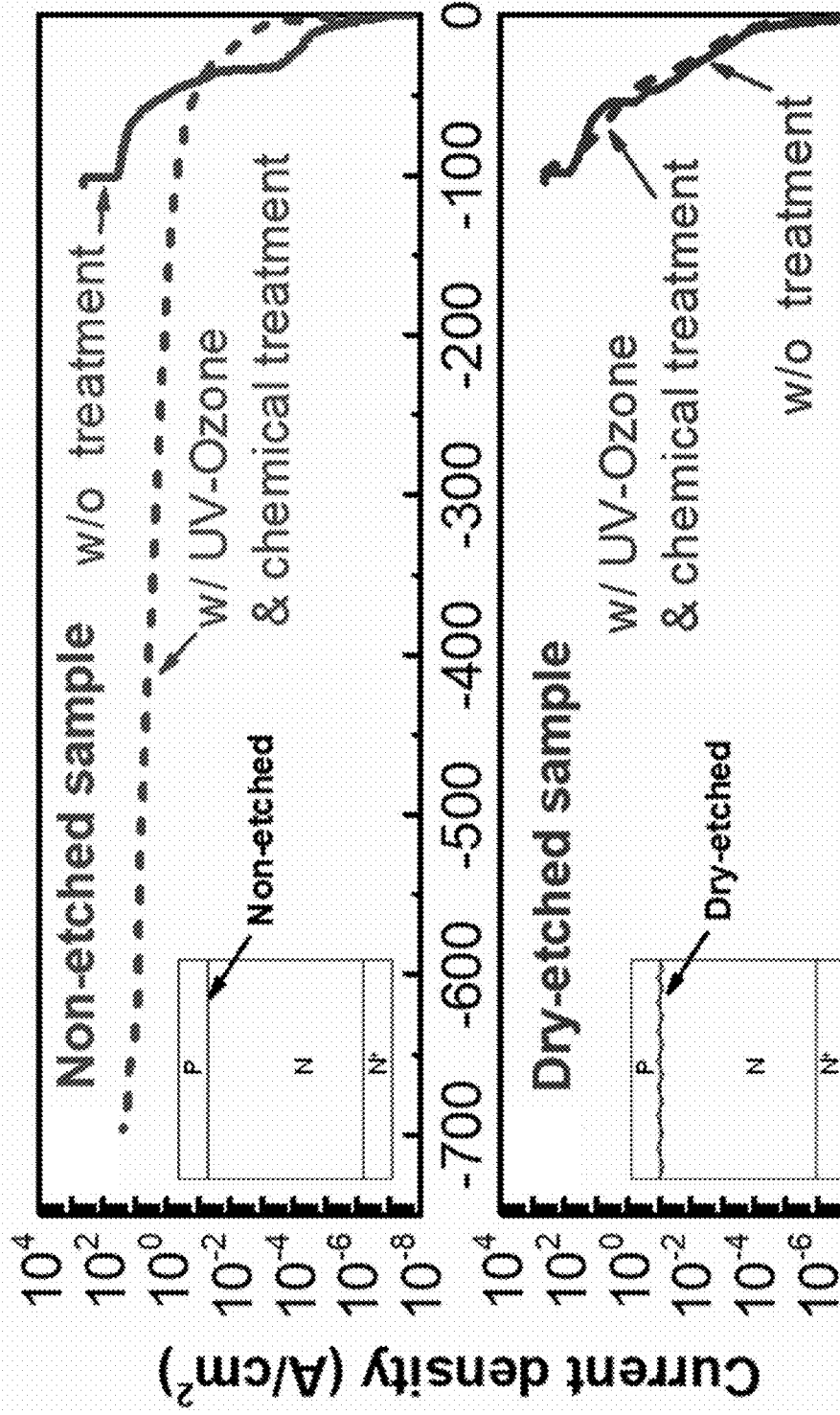
FIGS. 3A and 3B show reverse leakage current with and without UV-ozone combined chemical treatment for a non-etched sample and a dry-etched sample, respectively.

A chlorine-based inductively coupled plasma (ICP) dry etching recipe (ICP power=400 W, RF power=70 W, pressure=5 mTorr, $Cl_2$=32 sccm, $BCl_3$=8 sccm, Ar=5 sccm) was first used to etch the sample. To investigate the etching effects, another sample without dry etching was also co-loaded into the MOCVD reactor. No additional surface treatments were applied to the two samples except organic cleaning using acetone, isopropanol alcohol and deionized water. As shown by the solid lines in FIGS. 3A and 3B, the reverse leakage currents for both samples were large and the breakdown voltages were about 100 V. These results indicate that surfaces either with or without dry etching are not ideal for the regrowth process. Surface contaminants, dry etching damages, and/or native oxidations are possible causes for the large leakage currents.

Wet etching can be used to reduce surface contaminants, dry etching damages, and/or native oxidations. Before the regrowth, etched and non-etched samples were first treated by UV-ozone for 45 minutes to oxidize the surface. Then the samples were immersed in hydrofluoric (HF) acid for 5 minutes and hydrochloric (HCl) acid for 5 minutes to remove contaminants. As shown by the dashed lines in FIGS. 3A and 3B, after these chemical treatments, the non-etched sample showed a decreased leakage current and an increased breakdown voltage. No significant difference was observed for the etched sample. These results indicate that the non-etched surface can be improved by the UV-chemical treatment while the dry-etched surface may be too severely damaged by the plasma etching process to be repaired. Therefore, reducing the etching damage may help improve the reverse leakage characteristics of regrown GaN devices.

One way to reduce the ICP etching damage is to lower the RF power and reduce the physical plasma damages. A low-damage ICP etching recipe with a very low RF power was used for the etching process (ICP power 32 400 W, RF power=5 W, pressure=5 mTorr, $Cl_2$=32 sccm, $BCl_3$=8 sccm). The same UV-chemical treatment was also utilized to treat the samples before the regrowth process. As shown in FIG. 4A, with the low-damage ICP etching, the reverse leakage of the etched sample was decreased to a level below that of the non-etched sample. With a 50-nm-thick insertion layer, the reverse leakage current for the regrown sample is about 71.6 $\mu A/cm^2$ at −600 V, which is close to that of the as-grown sample. Therefore, low-damage etching is understood to be effective in reducing reverse leakage for the regrown GaN devices.

FIG. 4B shows the leakage currents at −600 V and charge concentrations at the regrowth interface extracted from capacitance-voltage (C-V) measurements for the regrown samples in FIG. 4A. The as-grown sample showed a low and constant charge concentration on the order of ~$10^{16}$ $cm^{-3}$. However, the regrown samples had high charge concentrations on the order of $10^{17}$-$10^{20}$ $cm^{-3}$ at the regrowth interface. Higher charge concentration at the regrowth interface can lead to a larger electric field and a thinner effective barrier for trap assisted tunneling. This could contribute to leakage currents in the regrown samples.

Figure 5:
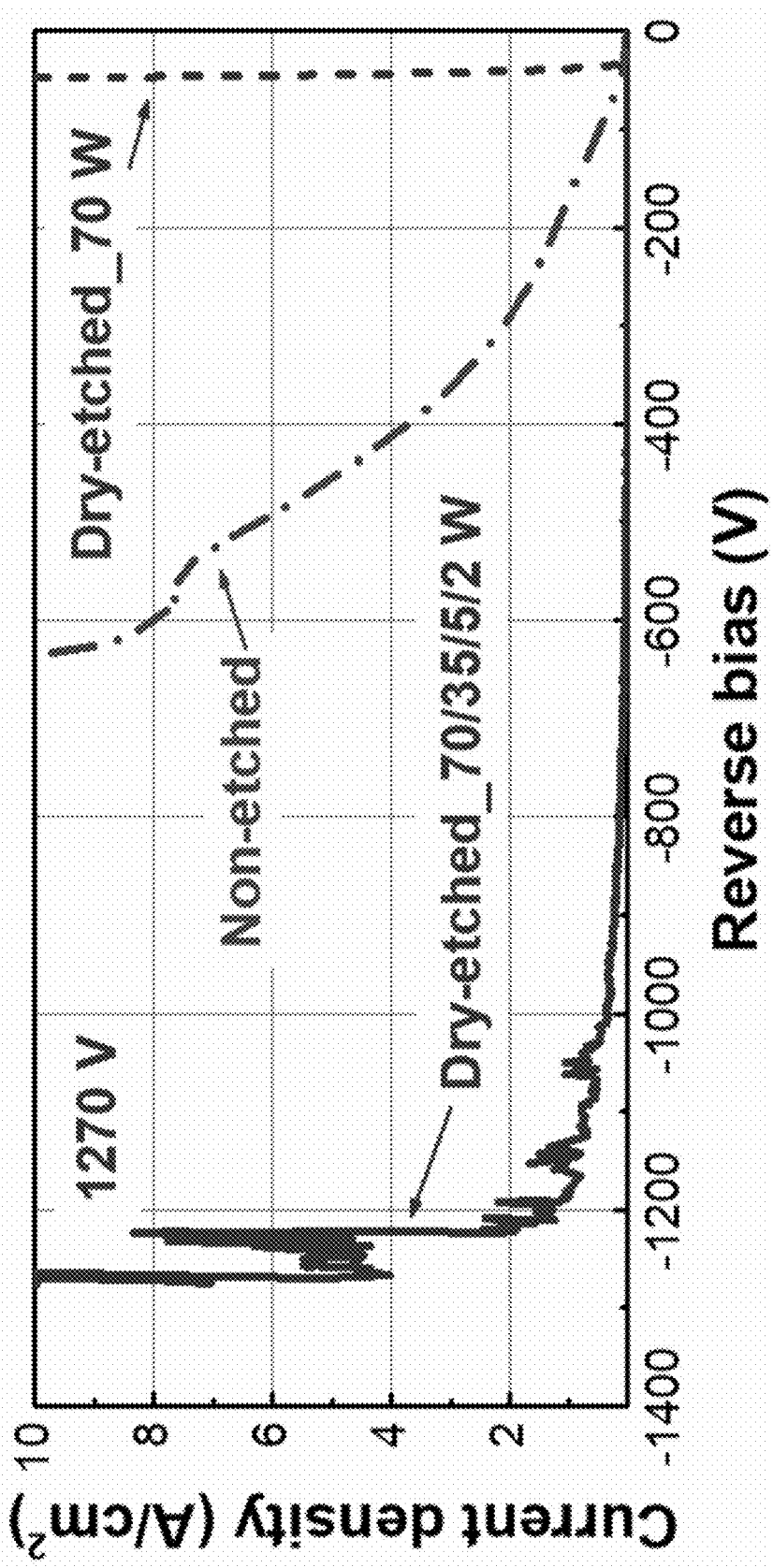
FIG. 5 shows reverse leakage curves for regrown p-n diodes on dry-etched and non-etched samples.

Although the low-damage etching could reduce the reverse leakage current, the etching rate can be slow (~20 nm/min). However, some practical applications require a high etching rate for deep trench structures. A multiple-RF-power etching recipe was developed using multiple etching steps with gradually decreased RF power from 70 W (~280 nm/min) to 35 W to 5 W to 2 W. The multiple-RF-power etching recipe gives reasonable etching rates and effectively reduces the reverse leakage. FIG. 5 shows that the regrown sample with the four-step-etching recipe exhibited a high breakdown voltage of 1270 V.

Figure 6A:
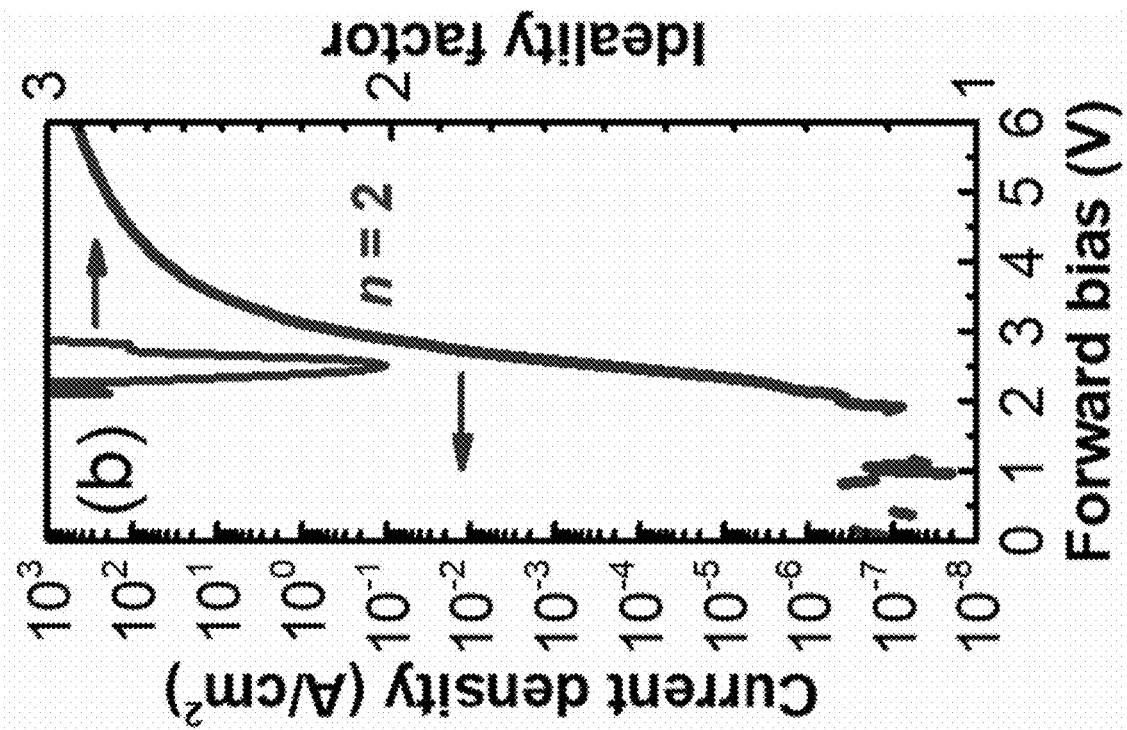
FIG. 6A shows a forward I-V curve in linear scale and differential on-resistance in logarithmic scale for the multiple-RF-power etched sample in linear scale.
Figure 6B:
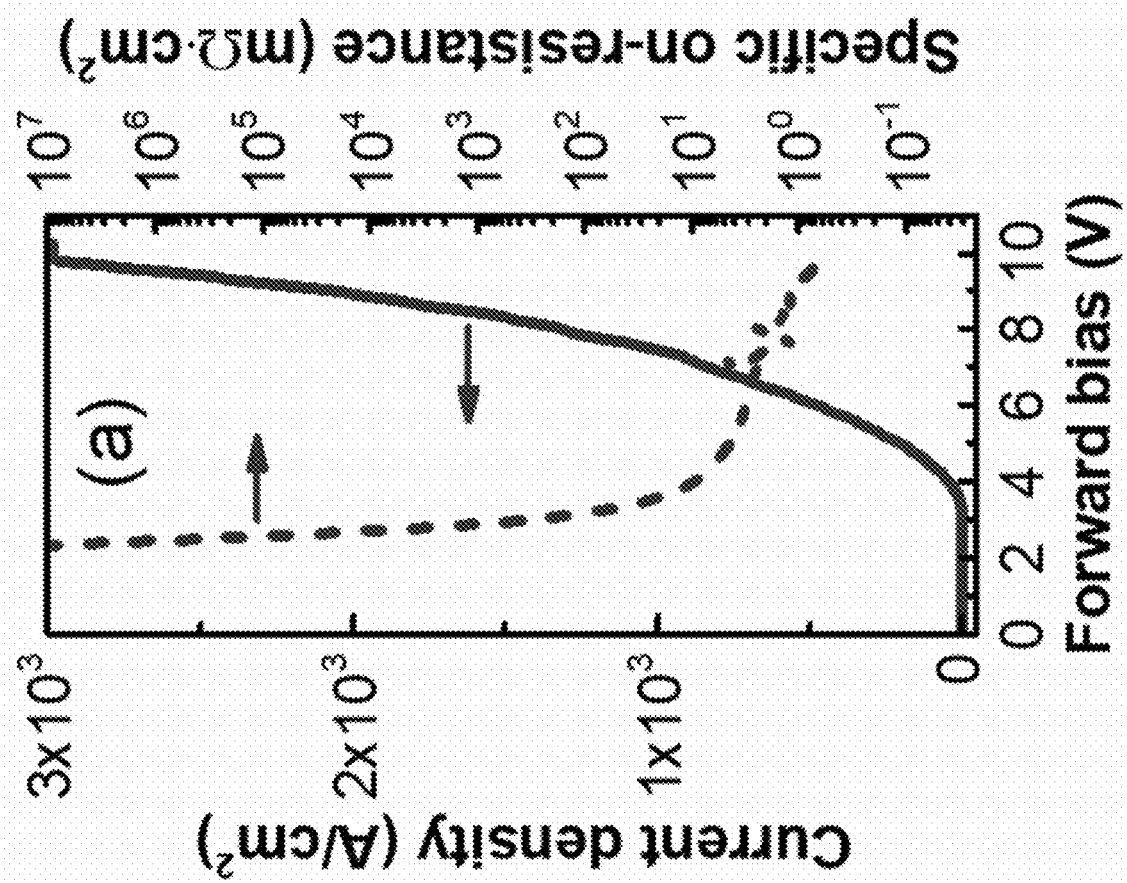
FIG. 6B shows a forward I-V curve and ideality factor in logarithmic scale.

Ideality factor is another factor used to evaluate the performance of a p-n junction. FIGS. 6A and 6B show the forward performance for the regrown p-n junction by the multiple-RF-power etching recipe. FIG. 6A shows current density versus forward bias, and FIG. 6B shows current density versus forward bias. The differential on-resistance is less than 0.8 mΩ·$cm^2$ and the ideality factor is 2. The Baliga's FOM ($V^2/R_{on}$) for the regrown p-n diodes fabricated as described in this disclosure is 2.0 $GW/cm^2$, which is comparable to some as-grown p-n diodes.

The device fabrication of regrown p-n diodes was completed using optical photolithography, dry etching, and metal lift-off processes. First, the samples were cleaned in acetone and isopropyl alcohol solvents to remove organic contaminations and dipped in hydrochloric acid before metal deposition to remove native oxides on the surface. Then, the mesa isolation of the devices was formed by the chlorine based ICP dry etching. The p-type ohmic contacts were formed by Pd/Ni/Au metal stacks that were deposited by electron beam evaporation and subsequently annealed by rapid thermal annealing (RTA). For the n-type ohmic contact, non-alloyed Ti/Al/Ni/Au stacks were formed at the backside of the substrates using electron beam evaporation. The device showed low leakage current of on the order of 10 nA at −600 V and high breakdown voltages of over 1200 V. The interface charge was also reduced according to C-V measurements.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A method for fabricating a regrown GaN p-n junction, the method comprising:
   depositing a n-GaN layer on a substrate comprising $n^+$-GaN;
   etching a surface of the n-GaN layer to yield an etched surface;
   depositing a p-GaN layer on the etched surface;
   etching a portion of the n-GaN layer and a portion of the p-GaN layer to yield a mesa opposite the substrate; and
   passivating a portion of the p-GaN layer around an edge of the mesa,
   wherein the regrown GaN p-n junction is defined at an interface between the n-GaN layer and the p-GaN layer.

2. The method of claim 1, wherein the n-GaN layer is unintentionally doped.

3. The method of claim 1, wherein depositing the n-GaN layer comprises metalorganic chemical vapor deposition.

4. The method of claim 1, wherein etching the surface of the n-GaN layer comprises wet etching.

5. The method of claim 1, wherein etching the surface of the n-GaN layer occurs in multiple steps.

6. The method of claim 5, wherein the multiple steps decrease in power.

7. The method of claim 5, wherein etching the surface of the n-GaN layer occurs in four steps of decreasing power.

8. The method of claim 1, further comprising cleaning the etched surface before depositing the p-GaN layer.

9. The method of claim 1, further comprising depositing an insertion layer between the etched surface and the p-GaN layer.

10. The method of claim 1, further comprising activating the p-GaN layer before etching the portion of the n-GaN layer and the portion of the p-GaN layer.

11. The method of claim 1, wherein etching the portion of the n-GaN layer and the portion of the p-GaN layer comprises dry etching.

12. The method of claim 1, wherein passivating the portion of the p-GaN layer comprises hydrogen-plasma passivation.

13. The method of claim 1, further comprising depositing a first metal stack on an outer surface of the p-GaN layer and a second metal stack on an outer surface of the substrate.

14. The method of claim 13, further comprising subjecting the first metal stack and the second metal stack to rapid thermal annealing.

15. A regrown GaN p-n junction comprising:
   a substrate;
   a n-GaN layer on the substrate, wherein a surface of the n-GaN layer is etched;
   a p-GaN layer on the etched surface;
   a mesa defined by an etched portion of the n-GaN layer and an etched portion of the p-GaN layer; and
   a passivated portion of the p-GaN layer around an edge of the mesa,
   wherein an interface between the n-GaN layer and the p-GaN layer defines the regrown GaN p-n junction.

16. The regrown GaN p-n junction of claim 15, wherein the substrate comprises $n^+$-GaN.

17. The regrown GaN p-n junction of claim 15, further comprising an insertion layer between the n-GaN layer and the p-GaN layer.

18. The regrown GaN p-n junction of claim 15, wherein a differential on-resistance of the GaN p-n junction is about 8 m$\Omega$ cm$^2$.

19. A device comprising the regrown GaN p-n junction of claim 15.

20. The device of claim 19, wherein the device comprises a junction barrier Schottky diode, a device with floating field rings, a field effect transistor, or a bipolar junction transistor.

* * * * *